United States Patent [19]
Mead et al.

[11] Patent Number: 5,083,044
[45] Date of Patent: Jan. 21, 1992

[54] SYNAPTIC ELEMENT AND ARRAY

[75] Inventors: Carver A. Mead, Pasadena; Timothy P. Allen, Palo Alto; Federico Faggin, Los Altos Hills; Janeen D. W. Anderson, Fremont, all of Calif.

[73] Assignee: Synaptics, Incorporated, San Jose, Calif.

[21] Appl. No.: 357,520

[22] Filed: May 25, 1989

Related U.S. Application Data

[63] Continuation-in-part of Ser. No. 322,490, Mar. 10, 1989, abandoned.

[51] Int. Cl.$^5$ .................... H03K 3/42; H03K 17/693; G11C 27/02
[52] U.S. Cl. .................. 307/311; 307/201; 307/353; 307/493
[58] Field of Search ............. 307/201, 264, 353, 493, 307/311

[56] References Cited

U.S. PATENT DOCUMENTS

| 4,247,818 | 1/1981 | Hiroshima et al. | 307/353 |
| 4,321,488 | 3/1982 | Srivastava | 328/151 |

FOREIGN PATENT DOCUMENTS 0108598 5/1988 Japan .................. 307/353

OTHER PUBLICATIONS

G. T. Davis, "Sample-and-Hold Switching Threshold Generator Using AC-Coupled Resistive Divider", IBM Tech. Disc. Bull., vol. 21, No. 1, Jun. 1978, pp. 29-30.

*Primary Examiner*—John Zazworsky
*Attorney, Agent, or Firm*—Kenneth D'Alessandro

[57] ABSTRACT

An electronic circuit is disclosed having a sample/hold amplifier connected to an adaptive amplifier. A plurality of such electronic circuits may be configured in an array of rows and columns. An input voltage vector may be compared with an analog voltage vector stored in a row or column of the array and the stored vector closest to the applied input vector may be identified and further processed.

4 Claims, 6 Drawing Sheets

SYNAPTIC ELEMENT AND ARRAY

RELATED APPLICATIONS

This application is a continuation-in-part of co-pending application serial No. 322,490, filed Mar. 10, 1989, entitled Synaptic Element and Array, now abandoned and assigned to the same assignee as the present invention.

BACKGROUND OF THE INVENTION

1. Field Of The Invention

The present invention relates to artificial neural networks and synapses. More particularly, the present invention relates to a single adaptable synapse and an array of adaptable synapses.

2. The Prior Art

Several schemes for using a matrix of electronic devices for neuron network applications have been proposed. To date, all such schemes involve using "weights" to control the amount of current injected into an electrical node "neuron". These weights were set by controlling the value of a resistor or the saturation current of a transistor. The limitation of any such scheme is that the value of any parameter of an electronic device in an integrated circuit is not well controlled. For example, the saturation currents of two MOS transistors of the same size can be different by a factor of 2 if these devices are operated in the sub-threshold regime. The "training" mechanism that adjusts the weights must take these uncertainties into account by iterating and testing the outcome of the weight-adjustment process. It is therefore desireable that an adaptive mechanism be found whereby the matrix element adjusts itself to any uncertainty in device parameters, as part of the training process.

BRIEF DESCRIPTION OF THE INVENTION

According to a first aspect of the present invention, an adaptable CMOS inverter circuit, as disclosed in a co-pending application Ser. No. 282,176, filed Dec. 9, 1988, entitled Subthreshold CMOS Amplifier With Offset Adaptation, now U.S. Pat. No. 4,935,702, issued June 19, 1990, which patent is expressly incorporated herein by reference, is cascaded with a sample/hold circuit. In a preferred embodiment such a sample/hold circuit includes a capacitor connected to an input through a pass gate. The adaptable CMOS inverter may be adapted to a selected voltage placed on the capacitor of the sample/hold circuit. The voltage on the input of the inverter is set by the sample/hold circuit, and the circuit is then adapted by illuminating the aperture located over the feedback capacitor in the amplifier with ultraviolet (U.V.) light as disclosed in U.S. Pat. No. 4,935,702. After the circuit has been adapted, the current flowing through it will be maximized when the voltage at the input of the circuit equals the voltage to which the circuit has been adapted.

According to a second aspect of the present invention, a plurality of adaptable CMOS amplifiers and associated sample/hold circuits are placed in a m by n array. The sample/hold inputs of all sample/hold amplifiers in one column are commonly connected to one of a plurality of write lines. The write lines are activated by a write decoder. The voltage input lines to each row of amplifiers in the matrix are commonly connected to a voltage input line. The current supplied to all amplifiers in a column is commonly provided by a sense line.

In order to adapt the matrix of the present invention, the voltages to which a given column of the matrix is to be adapted are placed onto the input voltage lines and into the sample/hold circuits of that column by activating the appropriate write decoder. The input voltages to successive columns are entered sequentially into their sample/hold circuits. The sequential update of the sample/hold voltages is continued, and the entire array is exposed to ultraviolet light for a period of time long enough to adapt the circuits.

According to a third aspect of the present invention, a readable synapse is disclosed. The stored analog voltage to which the synapse has been adapted can be read out onto an input/output line by applying a read signal to a read line. An array of readable synapses is also provided. A plurality of readable adaptable CMOS amplifiers and associated sample/hold circuits are placed in a m by n array. The sample/hold inputs of all sample/hold circuits in one column are commonly connected to one of a plurality of write lines. The write lines are activated by a write decoder. The voltage input lines to each row of sample/hold circuits in the matrix are commonly connected to an input/output line. The current supplied to all amplifiers in a column is commonly provided by a sense line. The read lines for all amplifiers in a row are connected to a common read line and the output of the read circuits of all amplifiers in a row are commonly connected to the input/output line.

BRIEF DESCRIPTION OF THE DRAWINGS

FIG. 1b is a plot of output current as a function of input voltage for the circuit of FIG. 1a.

FIG. 2 is a circuit diagram of a matrix containing a plurality of the circuits in FIG. 1a.

FIG. 8b is a graph showing the output current of the circuit of FIG. 8a.

FIG. 9 is a "loser-take-all" circuit for use with the postprocessing circuits of FIG. 8a.

DETAILED DESCRIPTION OF A PREFERRED EMBODIMENT

Figure 1A:
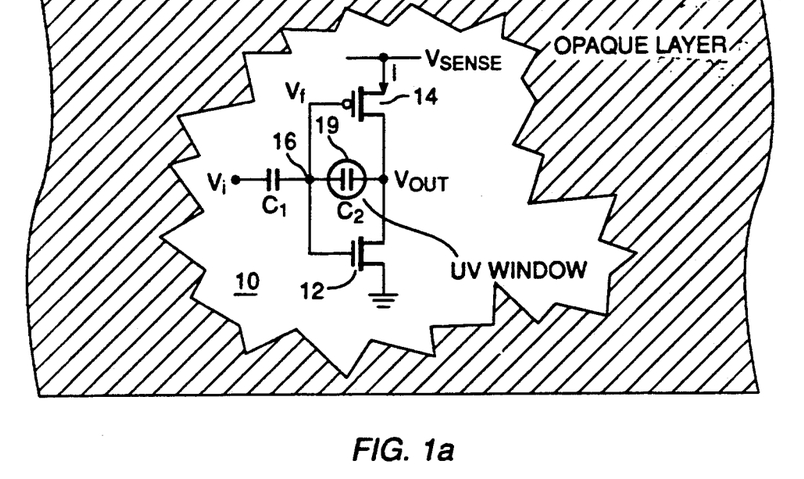
FIG. 1a is a schematic diagram of an adaptive CMOS inverting amplifier circuit according to a preferred embodiment of the present invention.

Referring first to FIG. 1a, an adaptive CMOS inverting amplifier 10 includes an N-channel MOS transistor 12 having its source connected to a source of negative voltage and its drain connected to the drain of a P-channel MOS transistor 14. The gates of N-channel MOS transistor 12 and P-channel MOS transistor 14 are connected together to an input node 16. The source of P-channel MOS transistor 14 is connected to a source of sense voltage $V_{sense}$. A first capacitor $C_1$ is connected between the input voltage source $V_i$ and input node 16. A second capacitor $C_2$ is connected between input node 16 and the output of inverting amplifier 10, the common connection of the drain of N-channel MOS transistor 12 and the drain of P-channel MOS transistor 14. An opaque layer 18 covers the active areas of the integrated circuit containing adaptive amplifier 10. An area above $C_2$ (shown at reference numeral 19) in the integrated circuit die containing the circuit of FIG. 1a is transparent to U.V. light. The theory and operation of amplifier 10 is fully disclosed in U.S. Pat. No. 4,935,702 , expressly incorporated herein by reference.

The amplifiers disclosed in this specification, and the amplifiers disclosed in U.S. Pat. No. 4,935,702 shall, for the purposes of the specification and claims herein, be referred to as "adaptive" amplifiers.

Figure 1B:
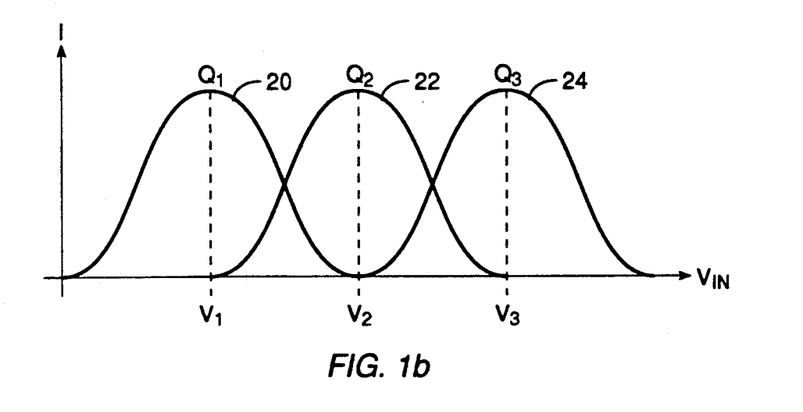

Referring now to FIG. 1b, curves 20, 22, and 24 show the current drawn by the inverting CMOS amplifier 10 as a function of input voltage for three cases in which the circuit has been adapted to different voltages V1, V2, and V3 respectively. A characteristic of the CMOS inverting amplifier 10 of FIG. 1a is that when the input voltage is equal to the voltage to which the circuit has been adapted, the output current is maximized as shown by curves 20, 22, and 24.

Figure 1C:
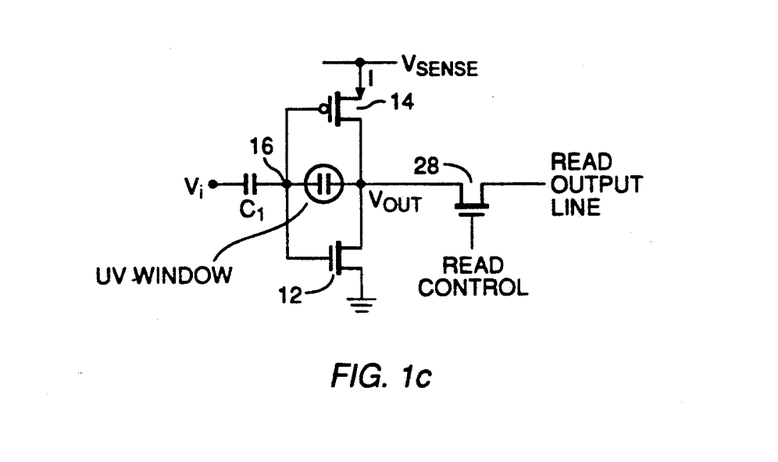
FIG. 1c is a schematic diagram of a readable CMOS adaptive amplifier according to a preferred embodiment of the present invention.

Referring now to FIG. 1c, a readable CMOS adaptive amplifier circuit 26 is shown. Readable CMOS adaptive amplifier circuit 26 is similar to CMOS adaptive amplifier circuit 10 of FIG. 1a, and includes an N-channel MOS transistor 12 having its source connected to a source of negative voltage and its drain connected to the drain of a P-channel MOS transistor 14. The gates of N-channel MOS transistor 12 and P-channel MOS transistor 14 are connected together to an input node 16. The source of P-channel MOS transistor 14 is connected to a source of sense voltage $V_{sense}$.

A first capacitor $C_1$ is connected between the input voltage source $V_1$ and input node 16. A second capacitor $C_2$ is connected between input node 16 and the output of inverting amplifier 10, the common connection of the drain of N-channel MOS transistor 12 and the drain of P-channel MOS transistor 14. An area above $C_2$ in the integrated circuit die containing the circuit of FIG. 1a is transparent to U.V. light.

An N-channel MOS read transistor 28 has its drain connected to the common connection of the drains of MOS transistors 12 and 14 (the output node of the CMOS adaptive amplifier circuit). Its source acts as the read output line which will be driven to the voltage value at the output node of amplifier circuit 26 when the gate of N-channel MOS read transistor 28 is brought high.

Figure 2:
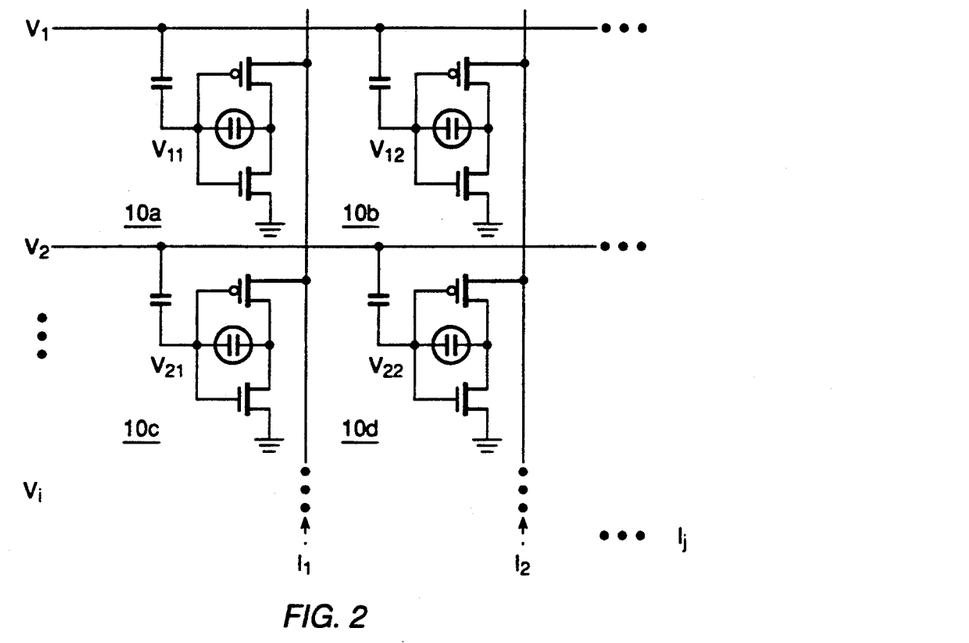

Referring now to FIG. 2, a matrix of four CMOS inverting amplifiers is shown. The first amplifier 10a and second amplifier 10b have their inputs connected together to a input voltage line $V_1$. Amplifiers 10c and 10d have their inputs connected together to a second input voltage line $V_2$. The sources of the P-channel transistors in amplifiers 10a and 10c are connected to a common sense line 34. The source of the P-channel MOS transistors in amplifiers 10b and 10d are connected to sense line 36.

One drawback of the array of FIG. 2 is that each amplifier on a common input voltage line is constrained to be adapted to the same voltage since the problem of selectively exposing the feedback capacitors of different amplifiers to ultraviolet light is significant.

Figure 3A:
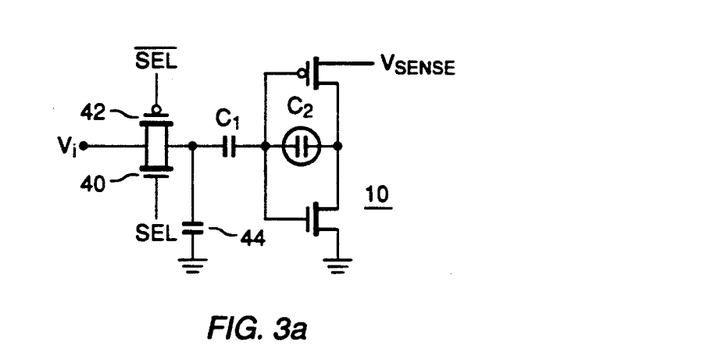
FIG. 3a is a schematic diagram of one embodiment of a combination of a sample/hold circuit in combination with a CMOS adaptive amplifier circuit.

One solution to this dilemma is the embodiment shown in FIG. 3a. Referring now to FIG. 3a, subthreshold CMOS inverting amplifier 10 has its input driven by a sample hold circuit comprising a pass gate including an N-channel MOS transistor 40 and P-channel MOS transistor 42. Complementary signals SEL and $\overline{SEL}$ are used to control the pass gate. When the pass gate is activated, the voltage $V_i$ appearing at the input of the pass gate is stored on capacitor 44. Because different voltages may be stored on the individual capacitors in the sample/hold circuits, individual amplifiers in the same row in an array may be adapted to different voltages.

Figure 3B:
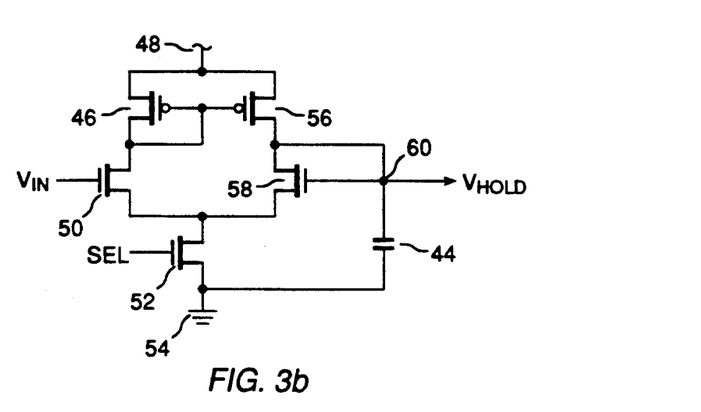
FIG. 3b is a schematic diagram of a presently-preferred embodiment of a sample/hold amplifier for use with the present invention.

Referring now to FIG. 3b, a presently-preferred embodiment of a sample/hold circuit for use with the present invention is disclosed. A first P-channel transistor channel 46 has its source connected to a source of positive voltage Vdd, shown at reference numeral 48, and its drain connected to the drain of a first N-channel MOS transistor 50. The gate of first P-channel MOS transistor 46 is connected to the drain of first N-channel MOS transistor 50. The source of first N-channel MOS transistor 50 is connected to the drain of second N-channel MOS transistor 52. The source of first N-channel transistor 52 is connected to a source of negative voltage Vss, shown at reference numeral 54. The gate of first N-channel MOS transistor 50 is connected to an input node $V_{in}$.

A second P-channel MOS transistor 56 has its source connected to the source of positive voltage 48, its drain connected to the drain of third N-channel MOS transistor 58, and its gate connected to the gate of first P-channel MOS transistor 46. The source of third N-channel MOS transistor 58 is connected to the source of first N-channel MOS transistor 50 and the drain of second N-channel MOS transistor 52. The gate of third N-channel MOS transistor 58 is connected to its drain, and to one plate of a holding capacitor 44. The other plate of holding capacitor 44 is connected to a source of fixed voltage, preferably Vss, shown at reference numeral 54. The output node 60 of the sample/hold circuit of FIG. 3b, is the common connection of the drain and gate of third N-channel MOS transistor 58 and the first plate of hold capacitor 44.

The circuit of FIG. 3b, known to those of ordinary skill in the art as a 5 transistor transconductance amplifier, is superior to the circuit of FIG. 3a because the output $V_{hold}$ is not disturbed when the select input, the gate of second N-channel MOS transistor 52, goes low, because any transient current is divided equally between first N-channel MOS transistor 50 and third N- channel MOS transistor 58. Therefore the effect on $V_{hold}$ cancels to the first order.

Figure 3C:
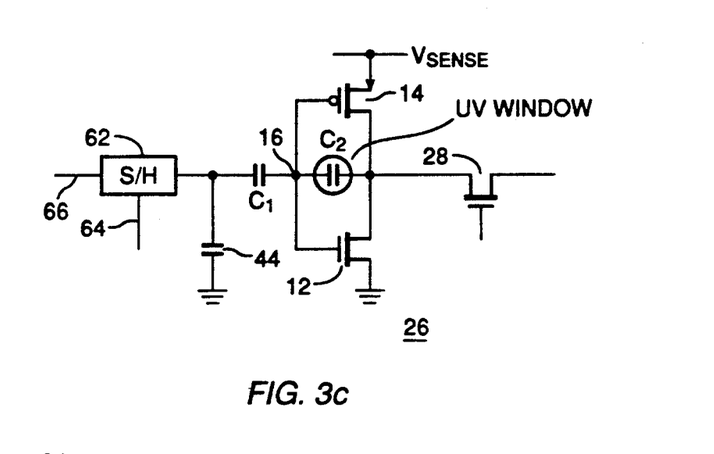
FIG. 3c is a schematic diagram of a presently preferred embodiment of a sample/hold circuit in combination with a readable CMOS adaptive amplifier circuit.

Referring now to FIG. 3c, a readable adaptable CMOS amplifier circuit 26 of FIG. 1c is shown in combination with a sample/hold circuit, shown as block 62. Those of ordinary skill in the art will realize that any of the sample/hold circuits shown herein, or their equivalents, may be employed.

When sample/hold input 64 is brought to a first logic state, the voltage appearing on the voltage input line 66 is passed through sample/hold circuit 62 and is stored on capacitor 44. Capacitor 44 is connected to the input of amplifier 26. When the sample/hold input of sample/hold circuit 62 is in a second logic state, the voltage input line 66 is isolated from the amplifier 26 and the voltage which appeared on voltage input line 66 when the sample/hold input 64 was brought to the second state is held across capacitor 44 and is presented to the input of amplifier 26.

Figure 4A:
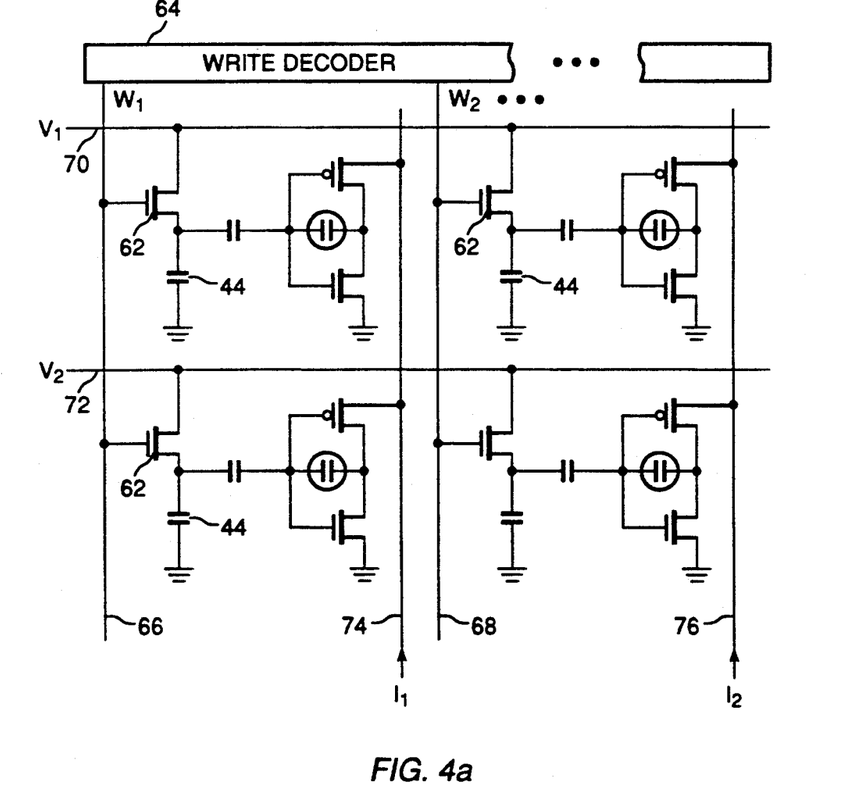
FIG. 4a is a schematic diagram of a matrix of circuits similar to those shown in FIG. 3a, but using only a single transistor for the sample/hold circuit.

Referring now to FIG. 4a, an illustrative embodiment of an array 70 of individual adaptable CMOS inverting amplifiers is shown. A pass gate consisting of a single N-channel MOS transistor 72 and a capacitor 44 form the sample/hold circuit in each of the CMOS inverting amplifiers of the array of FIG. 4. It should be noted that the reference numerals used in the adaptive amplifiers in the array of FIG. 4a are the same as those used in FIGS. 1a and 3a, except that the letters a, b, c, and d have been added to locate the position in the matrix of the array.

A write decoder 64 for the array has a plurality of output lines which drive the select lines of the sample/hold circuits. Two such lines, 74 and 76 are shown driving the first and second columns in the array, respectively. Write decoder 64 is a high active one of n decoder. Such decoders are well known in the art. In a presently-preferred embodiment, write decoder 64 will be integrated with the matrix and a CMOS decoder is preferred.

Input voltage lines 78 and 80 are connected to all of the amplifiers in the first and second rows of the array, respectively. Current sense lines 82 and 84 are connected to the sources of the P-channel transistors in the first and second columns of the array respectively.

The array of FIG. 4a may be programmed one column at a time by addressing a column of the array by placing a positive voltage on the select line (shown in FIG. 4a as either reference numeral 74 or 76) and placing the input voltage to which the individual amplifiers in the addressed column are to be adapted on each voltage input line (shown in FIG. 4a as reference numerals 78 and 80). After all of the input voltages to which all amplifiers are to be adapted have been placed in the sample/hold circuits the entire array is exposed to a source of ultraviolet light.

The circuit may then be used to associate a series of input vectors with the series of vectors stored as the adapted input voltages. All select lines are simultaneously brought to a positive level and the voltage vector to be associated is placed on the voltage input lines. The input vector will be closest to the vector stored in one particular column. The input will cause the current in the current sense line associated with that column to be the highest value.

Figure 4B:
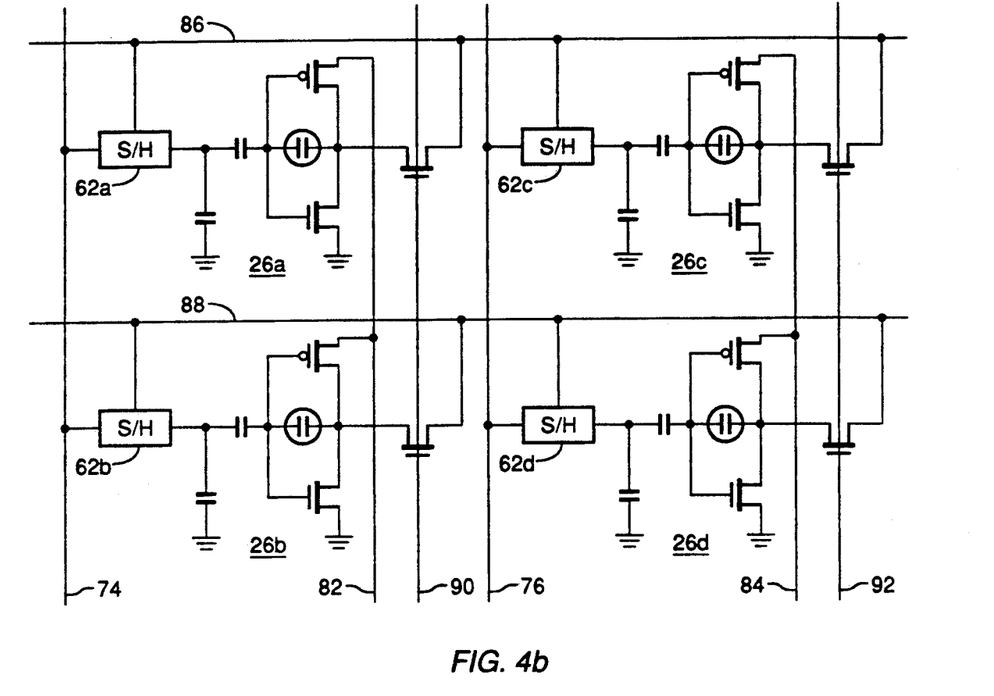
FIG. 4b is a schematic diagram of a matrix of circuits shown in FIG. 3c.

Referring now to FIG. 4b, a matrix of readable adaptable CMOS amplifiers 26a, 26b, 26c, and 26d are shown in combination with sample/hold circuits 62a, 62b, 62c, and 62d. Reference numerals corresponding to those of FIG. 3c are given to the circuit elements of FIG. 4b, except that the designations a, b, c, and d are given to denote matrix position.

Write line 74 is connected to the sample/hold inputs of sample hold circuits 62a and 62b in then first column of the array, and write line 76 is connected to the sample/hold inputs of sample/hold circuits 62c and 62d in the second column of the array. Sense line 82 is connected to the sense nodes of readable adaptable CMOS amplifiers 26a and 26b in the first column of the array and sense line 84 is connected to the sense nodes of readable adaptable CMOS amplifiers 26c and 26d in the second column of the array.

Input/output line 86 is connected to the voltage inputs of sample/hold circuits 62a and 62c and the read outputs of readable adaptable CMOS amplifiers 26a and 26c. Input/output line 88 is connected to the voltage inputs of sample/hold circuits 62b and 62d and the read outputs of readable adaptable CMOS amplifiers 26b and 26d.

Read line 90 is connected to the gates of read transistors 28a and 28c in readable adaptable CMOS amplifiers 26a and 26c. Read line 92 is connected to the gates of read transistors 28b and 28d in readable adaptable CMOS amplifiers 26b and 26d.

The array of FIG. 4b may be programmed one column at a time by addressing a column of the array by placing a positive voltage on the select line (shown in FIG. 4b as either reference numeral 74 or 76) and placing the input voltage to which the individual amplifiers in the addressed column are to be adapted on each voltage input line (shown in FIG. 4a as reference numerals 78 and 80). After all of the input voltages to which all amplifiers are to be adapted have been placed in the sample/hold circuits the entire array is exposed to a source of ultraviolet light.

The circuit may then be used to associate a series of input vectors with the series of vectors stored as the adapted input voltages. All select lines are simultaneously brought to a positive level and the voltage vector to be associated is placed on the voltage input lines. The input vector will be closest to the vector stored in one particular column. The input will cause the current in the current sense line associated with that column to be the highest value.

The analog voltages stored in the array may be read by bringing read line 90 or 92 to a high voltage while simultaneously disabling the circuits which are driving I/O lines 86 and 88. Well known circuitry for placing the outputs of such circuits in a high impedance state may be used for this purpose. The value appearing in the readable adaptable CMOS amplifiers in the column selected will appear on the I/O lines 86 and 88.

Figure 5:
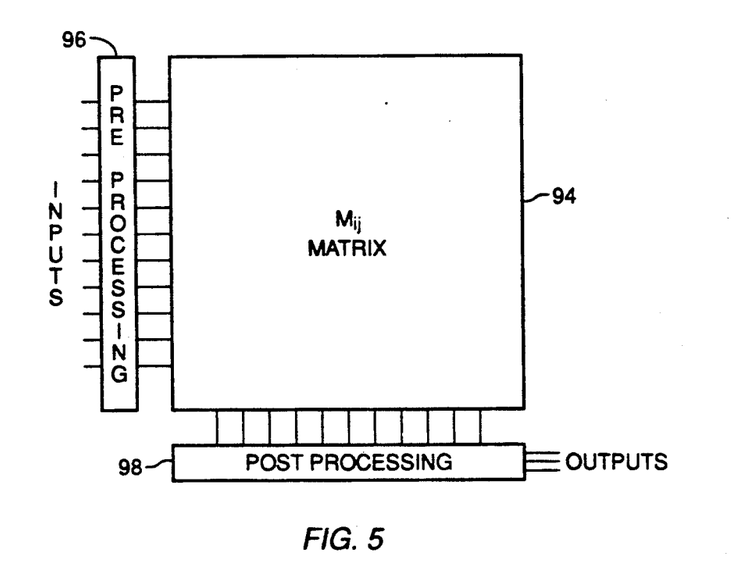
FIG. 5 is a block diagram of matrices of the type shown in FIGS. 4a and 4b and the preprocessing and postprocessing circuits associated therewith.

Referring now to FIG. 5, a matrix $M_{ij}$ of elements similar to those shown in FIG. 3a, shown at reference numeral 94, is connected to a plurality of inputs through a preprocessing circuit 96 and to a set of outputs through a post processing circuit 98.

Preprocessing circuit 96 may be used for the purpose of normalizing the inputs to the array. In real-world applications these inputs may have peak voltage values which vary over a wide range of voltages. The preprocessing circuit 96 may be used to normalize those voltages so that the magnitude of the resultant voltage vector is constant. An example of such a circuit is disclosed in B. Gilbert, *A Monolithic 16-channel Analog Array Normalizer*, IEEE Journal of Solid State Circuits, Vol. SC-19, No. 6, p. 956, December 1984, which is expressly incorporated herein by reference.

Figure 6:
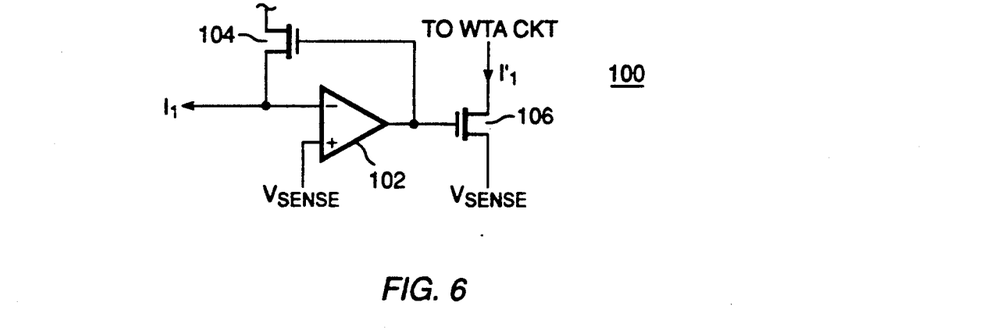
FIG. 6 is a schematic diagram of a sense amplifier for use in the postprocessing circuits of the present invention.

The sense lines 82 and 84 associated with the columns in the arrays of FIGS. 4a and 4b may each be connected to a sense amplifier circuit such as the one shown in FIG. 6. In the circuit of FIG. 6, a sense amplifier 100 includes an operational amplifier 102 having its noninverting input connected to $V_{sense}$, and its inverting input connected to the sense line of a particular column. An N-channel MOS transistor 104 has its drain connected to $V_{DD}$, a source of positive voltage, its source connected to the inverting input of operational amplifier 102 and its gate connected to the output of operational amplifier 102. A second N-channel MOS transistor 106 has its gate connected to the output of operational amplifier 102 and its source connected to $V_{sense}$.

The current flowing into the drain of N-channel MOS transistor 106, shown in FIG. 6 as $I'_1$ will be related to the current flowing in the sense line of the arrays of FIGS. 4a and 4b with which the circuit of FIG. 6 is associated. The circuit of FIG. 6 holds the sense line at the voltage $V_{sense}$ while making a replica of the current $I'_1$ for use in the post processing circuits.

Figure 7:
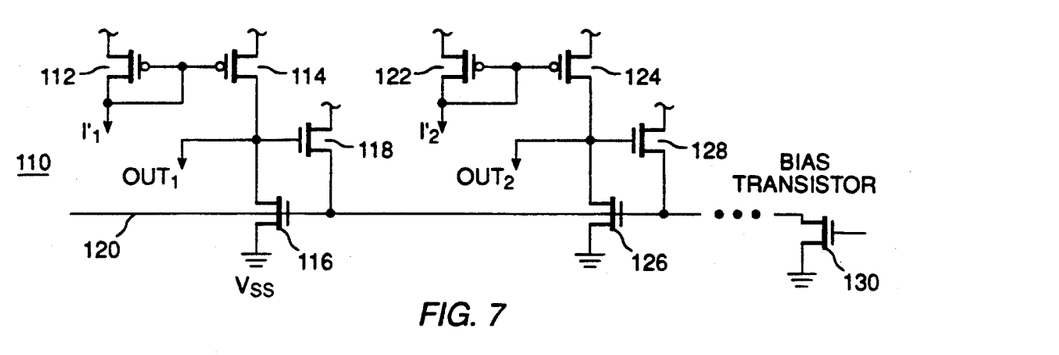
FIG. 7 is a schematic diagram of a "winner-take-all" circuit for use with the postprocessing circuits of the present invention.

Referring now to FIG. 7, a component of the post processing circuits 98 of FIG. 5, known as a "winner-take-all" circuit is shown. This circuit is completely disclosed in co-pending application Serial No. 277,795, Filed Nov. 30, 1988, which is expressly incorporated herein by reference.

In FIG. 7, winner-take-all circuit 110 includes a plurality of sections, two of which are shown. In the first section, a current mirror consisting of P-channel current mirror MOS transistor 112 and P-channel MOS current mirror transistor 114. The drain of P-channel current mirror transistor 114 is connected to the drain of N-channel MOS transistor 116. The source of N-channel MOS transistor 116 is connected to a source of negative voltage, shown in FIG. 7 as $V_{ss}$ or ground.

Another N-channel MOS transistor 118 has its source connected to a common gate line 120, its drain connected to a source of positive voltage and its gate connected to the common connection of the drain of N-channel MOS transistor 116 and the drain of P-channel MOS current mirror transistor 114. The node to which the gate of N-channel MOS transistor 118 is connected is the output current node for the column of the array of either of FIGS. 4a or 4b associated with that section, shown in FIG. 7 as $OUT_1$.

The second section of the circuit for the second column includes a current mirror comprising P-channel MOS current mirror transistors 122 and 124 and N-channel MOS transistors 126 and 128, connected in exactly the same manner as are the transistors for the first section. Common gate line 120 is connected to the drain of N-channel MOS transistor 130 whose purpose is to place a bias on gate line 120.

While the operation of the winner take all circuit in FIG. 7 is fully described in co-pending application Ser. No. 277,795 incorporated herein by reference, briefly, follower transistors 118, 128, etc., pull the common gate line 120 up to a voltage at which the current through the common gate pulldown devices 116, 126, etc., is equal to the maximum input current. This turns off all sections in the circuit except for the one having the largest current flowing through it.

Figure 8A:
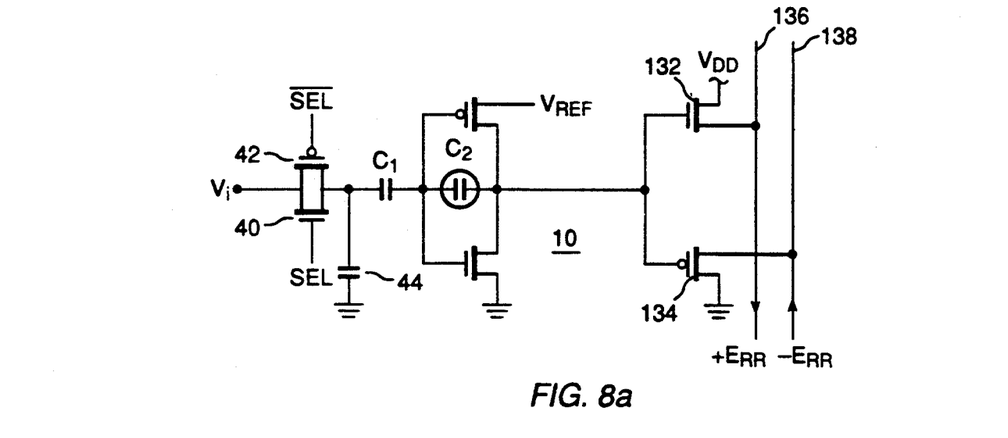
FIG. 8a is a schematic diagram of an alternative embodiment of a CMOS inverting amplifier and error current generating circuit for use with the present invention.

An alternate embodiment of the synaptic element of FIG. 3a is shown in FIG. 8a. Referring now to FIG. 8a, a CMOS inverting amplifier 10 is driven by a sample/hold circuit including the pass gate comprising N-channel transistor 40 and P-channel transistor 42 driven by SEL and $\overline{SEL}$, charging capacitor 44. In the circuit of FIG. 8a, the source of the P-channel transistor in amplifier 10 is connected to a source of reference voltage $V_{ref}$ and its output is taken from the common connection between the drains of the P-channel and the N-channel transistor.

However, unlike the embodiments of FIGS. 3a and 3b, the embodiment of FIG. 8a drives two follower transistors, N-channel transistor 132 and P-channel transistor 134. N-channel transistor 132 is biased by an error voltage $+E_{RR}$ and P-channel transistor 134 is biased by an error voltage $-E_{RR}$. The error lines, reference numerals 118 and 120 respectively, are biased such that if the output voltage of the amplifier 10 moves away from the center point, the current drawn starts to increase quadratically.

Figure 8B:
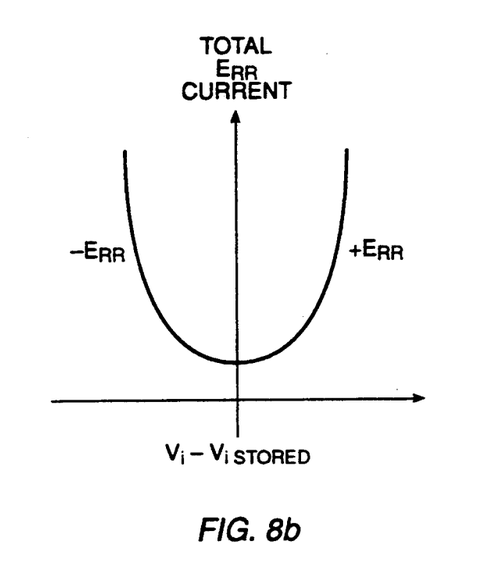

The total output current of the circuit of FIG. 8a is shown in FIG. 8b. The width of the curve in FIG. 8b is determined by $C_2$ and by the choice of the + and − error voltages which are used to bias lines 136 and 138. In both this circuit and that of FIG. 3a, the error current is a monotonic function of the unsigned difference between the amplifier output voltage and the output voltage at which the amplifier was adapted.

Figure 9:
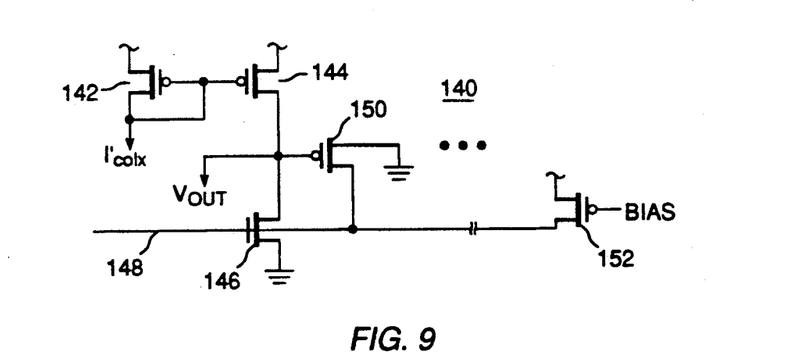

Referring now to FIG. 9, a post processing circuit 140 for use with an array of circuit such as that shown in FIG. 8a is disclosed. This circuit may be referred to as a "loser-take-all circuit" which causes the column having the lowest output current to be passed to the output. One section of a plurality of sections is shown.

In FIG. 9, a current mirror composed of P-channel MOS current mirror transistors 142 and 144 has its first P-channel MOS current mirror transistor 142 connected to the $I'_{colx}$ node and has its second P-channel MOS transistor connect in series with an N-channel MOS transistor 146. The N-channel MOS transistor 146 has its source connected to a source of negative voltage, shown in FIG. 9 as ground or Vss, and its gate connected to a common gate line 148 for N-channel transistors for all other legs driving all the other columns from the matrix. A third P-channel transistor 150 has its gate connected to the common connection of the drains of N-channel transistor 146 and P-channel transistor 144, its drain connected to ground, and its source connected to the common gate line 148 of the post processing circuit. A bias transistor 152 supplies a bias to common gate line 148.

The loser-take-all circuit 140 of FIG. 9 operates as follows. A bias current is injected into the common gate line 148 by bias transistor 152. That current is just balanced by the current out of the node $V_{out}$ passing through N-channel MOS transistor 146 of the section whose $V_{out}$ is the least. The lowest $V_{out}$ will correspond to the smallest input current in the current mirror, shown in FIG. 9 as 142 and 144, in the section having that least current. In operation, the voltage on node 148 will rise until the N-channel MOS transistor, shown associated with the first section as transistor 128, of one section is able to pull its $V_{out}$ low. This single low output will drain the bias current from node 148, and its voltage will stabilize such that the drain current of N-channel transistor 146 just balances in the input current. All sections with higher input currents will have $V_{out}$ high. Hence, this circuit functions as an encoder of the stage with the minimum input current.

When used with an array of cells with the type shown in FIG. 8a, the circuit of FIG. 9 encodes the column which has the minimum error current, and therefore whose stored vector is closest to the input vector.

While a presently-preferred embodiment of the invention has been disclosed, those of ordinary skill in the art will, from an examination of the within disclosure and drawings, be able to configure other embodiments of the invention. These other embodiments are intended to fall within the scope of the present invention which is to be limited only by the scope of the appended claims.

What is claimed is:

1. An electronic circuit fabricated as a part of an integrated circuit, said integrated circuit having a portion containing active circuits, said portion covered by an opaque layer, including in combination:
    a plurality of adaptive amplifiers arranged as an array including a plurality of columns and at least one row, each of said adaptive amplifiers having a gain of magnitude much larger than 1 and including:
        an output node,
        a sense node,
        an inverting input node, said input node being a floating node forming the gate of at least one MOS transistor,
        a first capacitor for coupling an input to said adaptive amplifier to said floating node, said first capacitor having a first electrode connected to said input to said adaptive amplifier and a second electrode connected to said floating node,
        a second capacitor connected from said output node to said floating node, said second capacitor having a first electrode connected to said output node and a second electrode connected to said floating node,
        said opaque layer having an aperture therein above said second capacitor for allowing ultraviolet light to fall onto both electrodes of said second capacitor;
    a voltage input line associated with each of said rows in said array, said voltage input line electrically connected to the first electrode of the first capacitor of each of said adaptive amplifiers associated with that particular row,
    a current output line associated with each of said columns in said array, said current output line electrically connected to the sense nodes of each of said adaptive amplifiers associated with that particular column.

2. The circuit of claim 1 further including winner take all means, connected to each of said current output lines, for providing a signal indicating which one of said current output lines is drawing the most current.

3. An electronic circuit fabricated as a part of an integrated circuit, said integrated circuit having a portion containing active circuits, said portion covered by an opaque layer, including in combination:
    a plurality of adaptive amplifiers arranged as an array including a plurality of columns and at least one row, each of said adaptive amplifiers having a gain of magnitude much larger than 1 and an offset voltage and including:
        an output node,
        a sense node,
        an inverting input node, said input node being a floating node forming the gate of at least one MOS transistor,
        a first capacitor for coupling an input to said adaptive amplifier to said floating node, said first capacitor having a first electrode connected to said input to said adaptive amplifier and a second electrode connected to said floating node,
        a second capacitor connected from said output node to said floating node, said second capacitor having a first electrode connected to said output node and a second electrode connected to said floating node,
        said opaque layer having an aperture therein above said second capacitor for allowing ultraviolet light to fall onto both electrodes of said second capacitor,
    a sample/hold circuit associated with each of said adaptive amplifiers, each of said sample/hold circuits having an input, a sample input, and an output, said output connected to said first electrode of said first capacitor,
    a voltage input/output line associated with each of said rows in said array, each of said voltage input lines electrically connected to the input of each of said sample/hold circuits associated with that particular row,
    a current output line associated with each of said columns in said array, each of said current output lines electrically connected to the sense node of each of said adaptive amplifiers associated with that particular column,
    a sample/hold line associated with each of said rows in said array, each of said sample/hold lines electrically connected to the sample inputs of each of said sample/hold circuits associated with that particular row,
    a plurality of switch means, including control means, associated with each of said columns in said array, said switch means connected between the output nodes of each of said adaptive amplifiers associated with that particular column and the one of said input/output lines with which a particular adaptive amplifier in said column is associated, for selectively coupling the output nodes of said adaptive amplifiers to said input/output lines,
    a control line associated with each of said columns in said array, for activating said switch means to place the voltage on the output nodes of selected adaptive amplifiers onto said input/output lines.

4. The circuit of claim 3 further including winner take all means, connected to each of said output lines, for providing a signal indicating which one of said current output lines is drawing the most current.

* * * * *